United States Patent
Choi et al.

(10) Patent No.: US 8,669,775 B2
(45) Date of Patent: *Mar. 11, 2014

(54) SCRIBE LINE TEST MODULES FOR IN-LINE MONITORING OF CONTEXT DEPENDENT EFFECTS FOR ICS INCLUDING MOS DEVICES

(75) Inventors: Youn Sung Choi, Plano, TX (US); Oluwamuyiwa Oluwagbemiga Olubuyide, Plano, TX (US); Gregory Charles Baldwin, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 413 days.

This patent is subject to a terminal disclaimer.

(21) Appl. No.: 12/890,123

(22) Filed: Sep. 24, 2010

(65) Prior Publication Data

US 2012/0074980 A1    Mar. 29, 2012

(51) Int. Cl.
*G01R 31/02* (2006.01)
(52) U.S. Cl.
USPC .................................................. 324/762.01
(58) Field of Classification Search
USPC .................................................. 324/762.01
See application file for complete search history.

(56) References Cited

U.S. PATENT DOCUMENTS

| | | | |
|---|---|---|---|
| 5,949,090 A * | 9/1999 | Iwasa et al. | 257/48 |
| 5,995,734 A * | 11/1999 | Saika | 716/52 |
| 6,223,331 B1 * | 4/2001 | Juengling | 438/128 |
| 6,456,104 B1 * | 9/2002 | Guarin et al. | 324/750.07 |
| 7,307,441 B2 * | 12/2007 | Sohn et al. | 324/750.3 |
| 7,586,322 B1 * | 9/2009 | Xu et al. | 324/762.09 |
| 2002/0179903 A1 * | 12/2002 | Seki | 257/48 |
| 2003/0062521 A1 * | 4/2003 | Jang et al. | 257/48 |
| 2003/0182644 A1 * | 9/2003 | Li et al. | 716/5 |
| 2005/0113951 A1 * | 5/2005 | Akiyama et al. | 700/97 |
| 2008/0109767 A1 * | 5/2008 | Arimoto | 716/2 |
| 2008/0173868 A1 * | 7/2008 | Kwon | 257/48 |
| 2008/0237586 A1 * | 10/2008 | Sun et al. | 257/48 |
| 2008/0265928 A1 * | 10/2008 | Tsuchiya | 324/763 |
| 2008/0279252 A1 * | 11/2008 | Vollertsen | 374/152 |
| 2009/0024968 A1 * | 1/2009 | Yamada | 716/4 |
| 2009/0079023 A1 * | 3/2009 | Berthold et al. | 257/499 |
| 2009/0144686 A1 * | 6/2009 | Lensing et al. | 716/10 |

(Continued)

OTHER PUBLICATIONS

Xi-Wei Lin, et al., "Layout Proximity Effects and Modeling Alternatives for IC Designs", Compact Variability Modeling for Nanometer CMS Technology, 2010, pp. 18-24.

(Continued)

*Primary Examiner* — Jermele M Hollington
*Assistant Examiner* — Demetrius Pretlow
(74) *Attorney, Agent, or Firm* — Warren L. Franz; Wade J. Brady, III; Frederick J. Telecky, Jr.

(57) ABSTRACT

An apparatus includes a plurality of die areas having integrated circuit (IC) die each having circuit elements for performing a circuit function, and scribe line areas between the die areas. At least one test module is formed in the scribe line areas. The test module includes a reference layout that includes at least one active reference MOS transistor that has a reference spacing value for each of a plurality of context dependent effect parameters, and a plurality of variant layouts. Each variant layout provides at least one active variant MOS transistor that provides a variation with respect to the reference spacing values for at least one of the plurality of context dependent effect parameters.

16 Claims, 4 Drawing Sheets

(56) References Cited

U.S. PATENT DOCUMENTS

| | | | |
|---|---|---|---|
| 2009/0200546 A1* | 8/2009 | Marokkey | 257/48 |
| 2009/0212793 A1* | 8/2009 | Guldi et al. | 324/751 |
| 2009/0243645 A1* | 10/2009 | Shinkawata | 324/765 |
| 2009/0309097 A1* | 12/2009 | Hsieh | 257/48 |
| 2010/0005442 A1* | 1/2010 | Ghinovker et al. | 716/21 |
| 2010/0038683 A1* | 2/2010 | Shanware et al. | 257/204 |
| 2010/0122231 A1* | 5/2010 | Agarwal et al. | 716/19 |
| 2010/0148235 A1* | 6/2010 | Toubou et al. | 257/296 |

OTHER PUBLICATIONS

P.G. Drennan, et al., "Implications of Proximity Effects for Analog Design", Freescale Semiconductor, Inc.

* cited by examiner

SCRIBE LINE TEST MODULES FOR IN-LINE MONITORING OF CONTEXT DEPENDENT EFFECTS FOR ICS INCLUDING MOS DEVICES

FIELD

Disclosed embodiments relate to semiconductor wafers including integrated circuit (IC) die having scribe line test modules.

BACKGROUND

This application relates to subject matter that may be similar to application Ser. No. 12/890,146 filed Sep. 24, 2010, the entirety of which is hereby incorporated by reference.

As known in the art, a plurality of production IC die are formed on a semiconductor wafer by performing semiconductor processing including lithography, etch, ion implant and thin film processes. Following formation of the IC die, the wafer is sawed for singulation of the die. The wafer spaces between the IC die used for sawing the wafer are referred to as scribe line areas.

To assess electrical properties of elements (e.g., MOS transistors) constituting an IC die, a predetermined pattern of measuring elements or test elements (called test modules) are formed in the scribe line areas of the wafer to allow generation of in-line (i.e. production) test data. The test module is electrically tested by a test system including a probe card, prober system and measurement apparatus, and testing can be performed after deposition of an early metal interconnect level (e.g., first metal level) or after completion of wafer processing, for determining whether circuit elements such as MOS devices are suitably formed (e.g., have proper threshold voltage and breakdown voltage) in the IC die formed on the wafer. Since the test module is formed using the same process as the process for forming the circuit elements formed on the IC die, and often having the same device layout, testing electrical properties of the devices in the test module can be identical to testing electrical properties of the circuit elements formed in the production IC die. Accordingly, the properties of the IC die can generally be accurately deduced by testing the test modules.

Conventional scribe line test modules, particularly for analog and mixed signal technologies, have significant constraints on both wafer scribe line area and scribe test time given the extensive component count and electrical tests needed to properly characterize the die circuitry. A standard 1×16 (1 pin wide, 16 pins long) test module can accommodate up to four MOS devices, with a separate pin used for each of the MOS sources, gates, drains, and substrate/body terminals. Other scribe line test modules use a multiplex arrangement that raises the number of placed devices per pin in the test module, to achieve more placed devices than the number of test pins.

SUMMARY

As known in the art, integrated circuit (IC) device performance is impacted by layout features located near the device, even when not part of the device, particularly for 28 nm technology nodes and smaller. For MOS transistors, the parameters affected by adjacent layout features generally include drive current and threshold voltage (Vt).

Disclosed embodiments describe scribe line test modules for in-line (i.e., on production wafers including production IC die) monitoring of context dependent effects during the production of ICs. As used herein, known "context dependent effects" include at least eight different proximity effects: well (e.g., p-well or n-well) proximity effect, active area proximity effect, dual stress liner (DSL) boundary proximity effect (for stressed designs), STI stress effect (for shallow trench isolation designs), strain engineered stress (e.g., SiGe for pMOS source/drain and SiC for nMOS source/drain) effect, length of gate oxide definition (LOD) effect, polysilicon (poly) proximity effect, contact proximity effect, non-rectangular active area effect, and active area jog effect.

Most of these known context dependent effects cannot be isolated from other context dependent effects using a single layout structure. As a result, to be able isolate all such context dependent effects to allow a monitor that quantifies (i.e., provides a quantifiable relationship between an electrical parameter such as Vt or drive current and a spacing such as LOD for a range of LOD) for all of these context dependent effects, at least several hundred different layout structures would be needed.

However, the width of the scribe line on production wafers is currently typically only around 50 µm, or less, making the scribe line area very limited. As a result, only a small percentage of the several hundred different layout structures needed for isolating the known context dependent effects can be fit within the scribe line area of the wafer, making it impractical currently for a scribe line test module to be able to isolate these effects to allow monitoring substantially all, or even a significant percentage, of the known context dependent effects on production wafers. By identifying the more significant context dependent effects, including combined effects, a test module having a reduced number of layout structures can be configured as disclosed herein that enables a test module to be fit within the scribe line area yet still provide in-line production monitoring and context dependent effect parameter isolation to allow quantification of those known context dependent effects found to be more significant in effect.

Disclosed example embodiments include an apparatus (e.g., a semiconductor wafer) comprising a plurality of die areas having production IC die each of which has circuit elements for performing a circuit function and scribe line areas between the die areas. At least one test module is formed within the scribe line areas. The test module includes a reference layout that has at least one active reference MOS transistor with a reference spacing value for each of a plurality of context dependent effect parameters. The test module also includes a plurality of variant layouts, wherein each of the variant layouts includes at least one active variant MOS transistor that provides a variation with respect to the reference spacing values for at least one of the plurality of context dependent effect parameters.

DETAILED DESCRIPTION

Figure 1:
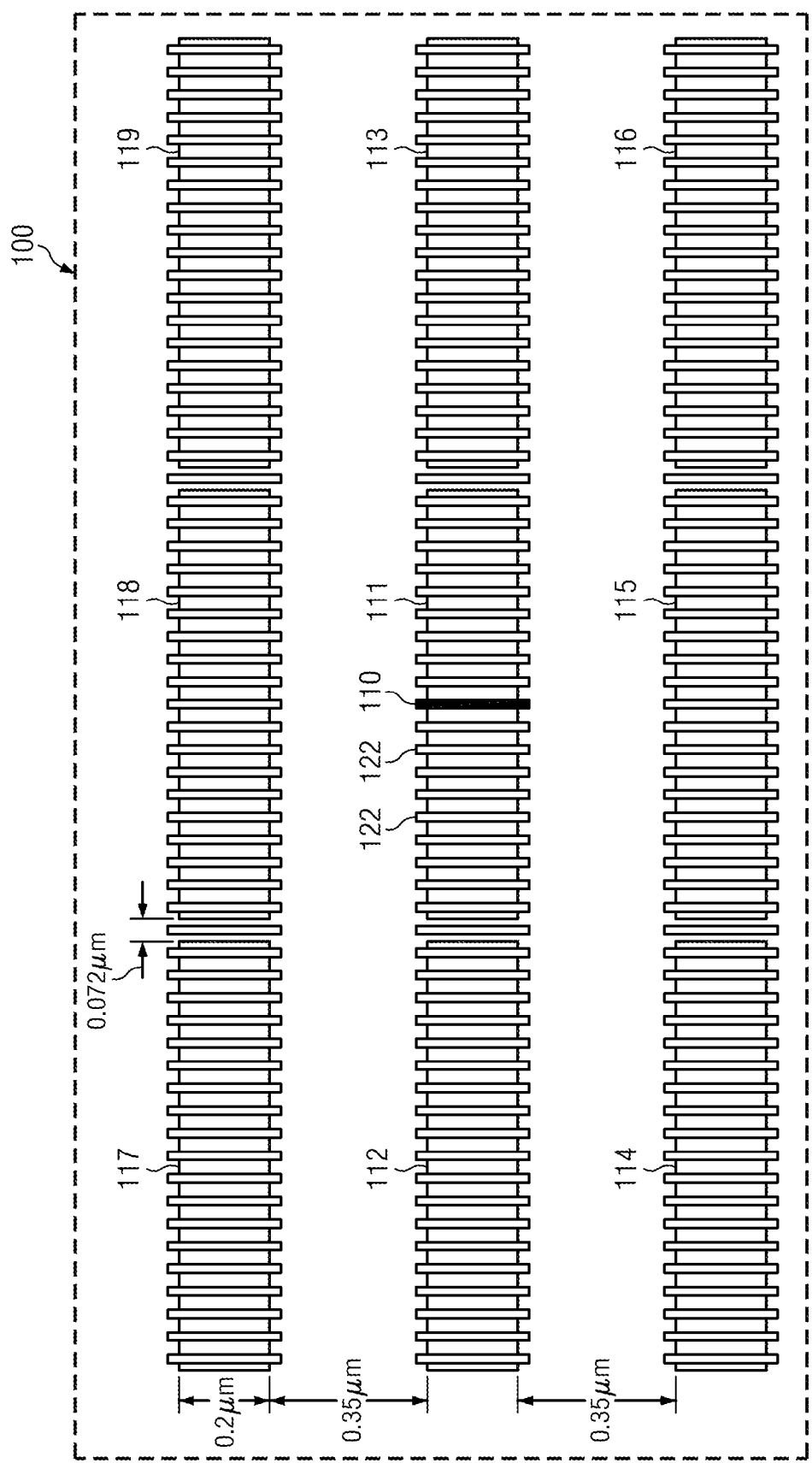
FIG. 1 shows an example reference layout that includes an active reference MOS transistor, which has its electrical behavior modeled in an IC simulation model, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 shows an example standard cell-based reference layout 100 that is compact for placement within a small portion of a scribe line test module, according to an example embodiment. As known in the art and used herein, a "standard cell" layout for a test module has the same standard dimensions and configuration as the corresponding dominant layout used in one or more sets of "standard cells" in the IC die area (e.g., standard IC design cells implementing NAND, NOR, NOT, etc. logic gates) on the wafer. This includes, for example, gate widths, doped well configurations, transistor pitches and spacings, and active area widths and spacings typical of such standard cells. Some IC designs use more than one library of standard cells and hence disclosed embodiments may include more than one "standard cell" test module layout.

The example reference layout 100 measures about 6 μm long and 1.5 μm wide. Reference layout 100 includes an active reference nMOS transistor 110 (hereafter "reference transistor 110"), the layout (e.g., gate width and length, and width/length) being selected based on a typical MOS transistor in the production IC die in the die areas of the wafer. As used herein, "active" transistors in layouts for scribe line test modules are electrically connected to probe pads through metal leads and typically addressing circuitry to permit testing, and are shown in the FIGs. as having solid bolded gates to distinguish them from dummy (electrically unconnected) gates which are shown as open and non-bolded rectangles. The gate, source, drain and body of the reference transistor 110 are connected by patterned interconnect metal leads to respective bond pads to permit testing using a probe system including, e.g., a probe card.

The electrical behavior of reference transistor 110 is modeled in an IC simulation model (e.g., SPICE model) to provide a reference point in the model, that can include setting context dependent effect parameter measures associated with its reference spacing values to zero. Reference transistor 110 can thus be used as a baseline, against which comparisons are made to other devices. Comparison to a reference (or baseline) device isolates systematic offsets from sources of global variation, in the same way that matching devices in circuitry helps to remove global variation.

The reference transistor 110 shown in FIG. 1 may be an nMOS transistor with a gate (e.g., polysilicon gate) formed to extend laterally over the middle of a p-doped active area 111, and having nine dummy gates 122 (e.g., polysilicon gates) on either side extending laterally over the same isolated active area 111. The shown active area 111 is a region of semiconductor (e.g., silicon) material on a wafer substrate laterally isolated by surrounding dielectric (e.g., oxide) material from neighboring isolated semiconductor material regions. The dummy gates 122 are formed using the same processes and parameters as the active reference transistor 110 but are left unconnected and are thus electrically floating. There are nine active areas 111-119 in the example reference layout 100 (one functional active area 111 and eight dummy active areas 112-119), all of which are formed using the same or similar processes and parameters, and which may be formed as p-doped active areas, n-doped active areas, or some combination of p-doped and n-doped active areas.

The active area-to-active area spacing in the gate width direction from active area 111 to active area 118 (above) and from active area 111 to active area 115 (below) in the example shown in FIG. 1 is 0.35 μm. The active areas may be further doped to provide active or dummy channel regions and active or dummy source/drain regions using nMOS doping, pMOS doping, or a mixture of both nMOS and pMOS doping formulations. For the example reference layout 100 given in FIG. 1, reference transistor 110 is the only active transistor and is, for example, doped to provide an nMOS transistor having n-doped source/drain regions. The gate and active area materials, dimensions and processing parameters are chosen to match the corresponding materials, dimensions and processing parameters of corresponding elements formed in the IC die area.

Figure 2:
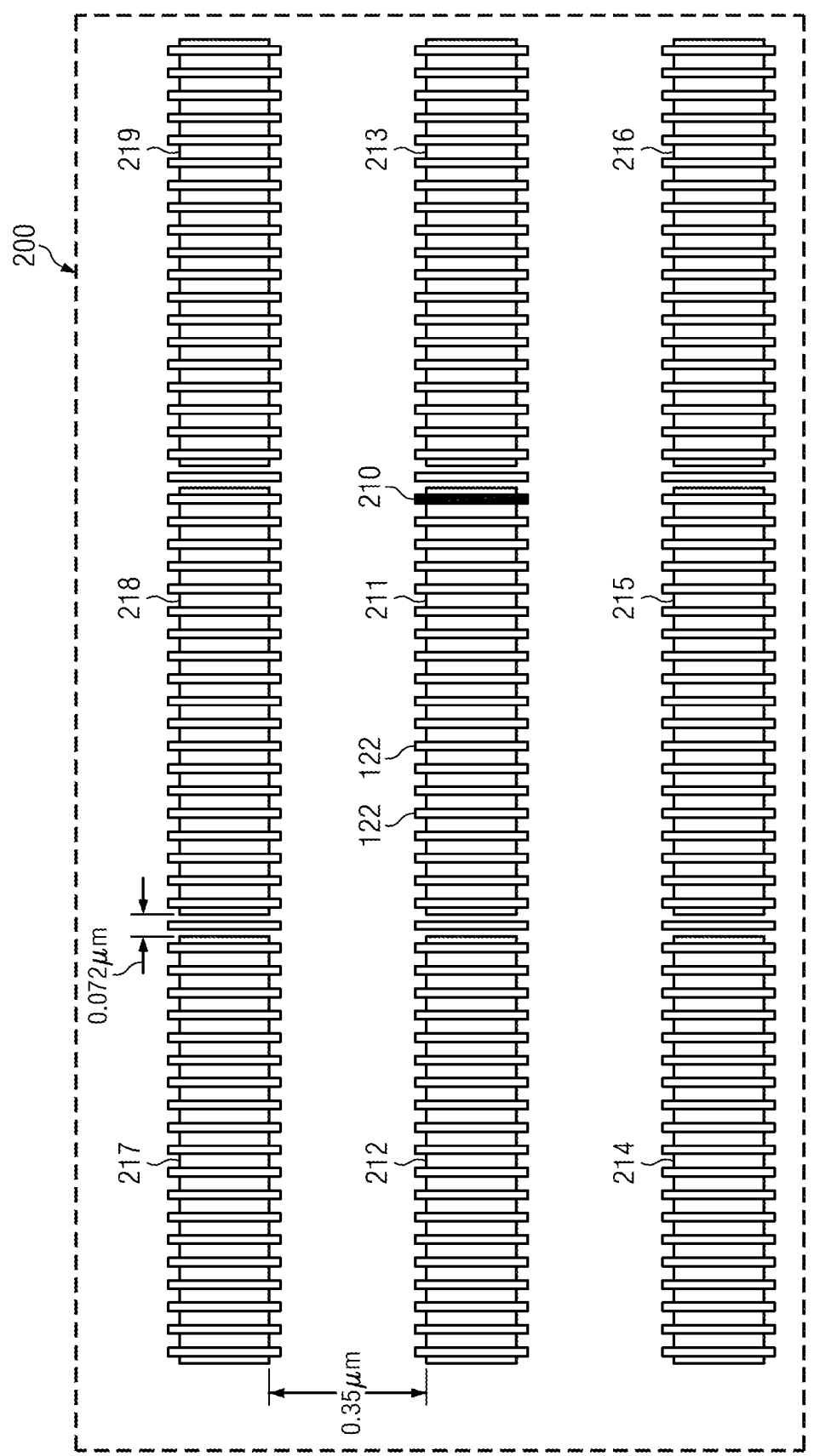
FIG. 2 shows an example variant layout providing context variation of one context dependent effect parameter shown as the length of gate oxide definition (LOD) parameter, according to an example embodiment.

FIG. 2 shows an example variant layout 200 that is compact for placement within a small portion of a scribe line test module providing systematic context variation for a known context dependent effect parameter, such as, for example, the length of gate oxide definition (LOD) parameter. The example layout 200 measures about 6 μm long and 1.5 μm wide, the same as reference layout 110 shown in FIG. 1. Layout 200 also has nine p-doped active areas 211-219 (one functional active area 211 and eight dummy active areas 212-219). The sole active transistor in the layout shown in FIG. 2 is active variant nMOS transistor 210 having a gate at the far right edge of active area 211, in contrast to the gate of reference transistor 110 shown in FIG. 1 which is located in the middle of corresponding active area 111. Note that the lateral spacing between the active areas in the gate width direction, such as between active areas 211 and 218, may be 0.35 μm, the same as for reference transistor 110 shown in FIG. 1.

Figure 3:
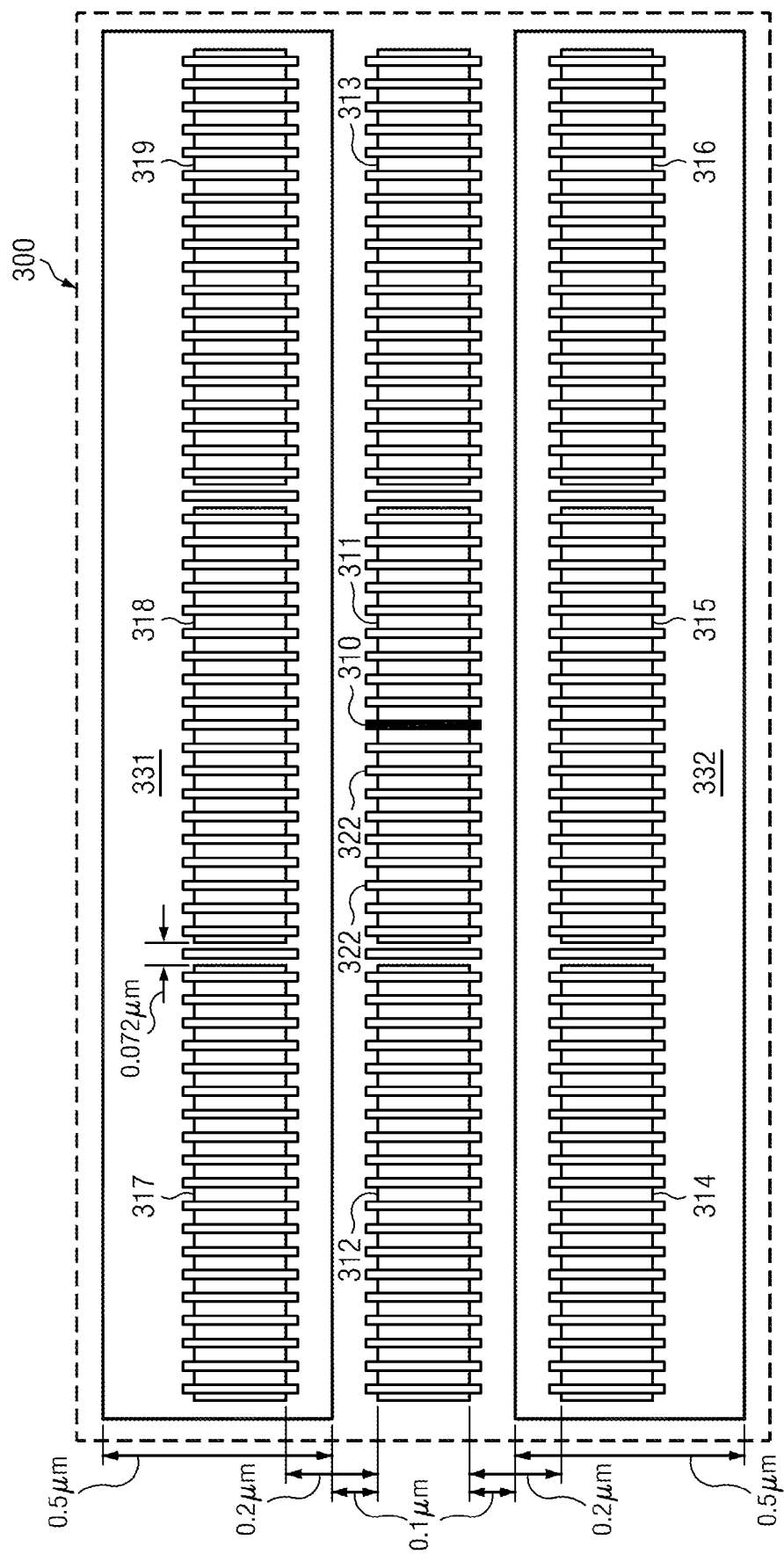
FIG. 3 shows an example variant layout providing context variation for a plurality of context dependent effect parameters, according to an example embodiment.

FIG. 3 shows an example second variant layout 300 that is compact for placement within a small portion of a scribe line test module providing systematic context variation involving a plurality of different context dependent effect parameters. The active areas in layout 300 are shown as 311-319 (again, one functional active area 311 with an active transistor gate and eight non-functional active areas 312-319 with only dummy gates). An example 0.072 μm spacing is shown between active areas 317 and 318 in the gate length direction. Layout 300 includes doped well regions 331 and 332 within which n-doped active areas 314-319 are formed. The active areas 314-319 may include SiGe in p-doped (p+) source/drain regions corresponding to enhanced performance pMOS transistor recipes. Active areas 311-313 are p-doped. The active variant nMOS transistor 310 is positioned in the center of its active area 311 so that there is no LOD variance with respect to the LOD spacing for reference transistor 110.

As shown, the active variant nMOS transistor 310 in FIG. 3 can be seen to provide variance vs. the reference transistor 110 shown in FIG. 1 for a plurality of context dependent effect parameters. The variances comprise: the active area-to-active area spacing (e.g., active area 311 spaced 0.2 μm in the gate width direction from the adjacent active areas 315, 318 vs. 0.35 μm for the example reference layout 100 of FIG. 1), the vertical well proximity (e.g., 0.1 μm between active area 311 and n-doped well region 331 vs. no vertical well proximity effect shown in FIG. 1), and the dual stress liner (DSL) boundary (e.g., 0.1 μm between n-doped well region 331 and active area 311 vs. no vertical DSL boundary effect shown in FIG. 1), and opposite active proximity (e.g., 0.2 μm between active area 318 and active area 311 vs. no opposite active proximity effect shown in FIG. 1). The opposite active proximity effect for nMOS relates to the stress effect of compressive stress layers such as SiGe in the pMOS p-type source/drain regions that are proximate to nMOS devices in a p-doped active area, such as active variant nMOS transistor 310 in p-doped active area 311.

The specific context dependent effects described above are only a few examples of the many context dependent effects that may exist, and it should be appreciated that, in general, any context dependent effect may be provided in the test modules. For example, other context dependent effects can include additional active proximity effects (APEs) such as missing or present neighboring active area.

Figure 4A:
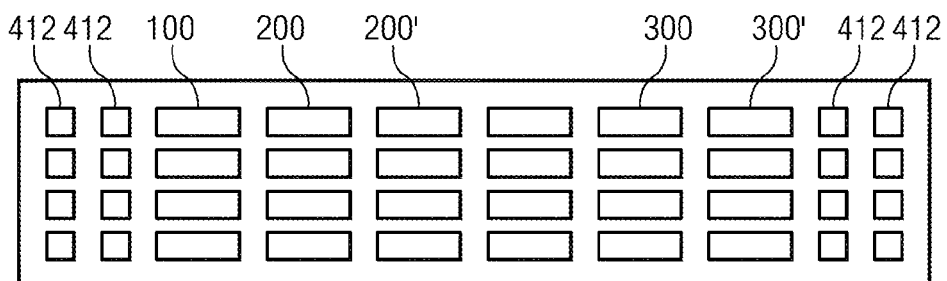
FIG. 4A shows an example scribe line test module comprising a plurality of different layouts, according to an example embodiment.

FIG. 4A depicts an example scribe line test module 408 comprising reference layout 100 and a plurality of different variant layouts including layouts 200, 200', 300 and 300'. Bond pads 412 are coupled to the respective active devices on the various layouts (e.g., connected via one or more metal level interconnects) to enable automatic testing with a probe system including, e.g., a probe card. Variant layouts 200' and 300' represent variant layouts 200 and 300, respectively, modified to have intermediate spacing values for at least one of the context dependent effect parameters. For example, variant layout 200' may have the active variant transistor (corresponding to active gate 210 in FIG. 2) positioned between the middle and the edge of the functional active area (corresponding to active area 211 in FIG. 2), in comparison to the far right edge position of active variant transistor 210 shown in FIG. 2 of the central position of reference transistor 110 shown in FIG. 1.

Test module 408 thus provides at least two systematic variant layout combinations comprising variant layouts 200 and 200' and variant layouts 300 and 300'. For example, variant layout 200 provides a first systematic layout including an active variant MOS transistor that provides a first variation with respect to a reference spacing value for a context dependent effect parameter (e.g., LOD) and a second systematic layout 200' including an active variant MOS transistor that provides a second variation with respect to the reference spacing value for the context dependent effect parameter (e.g., LOD).

Figure 4B:
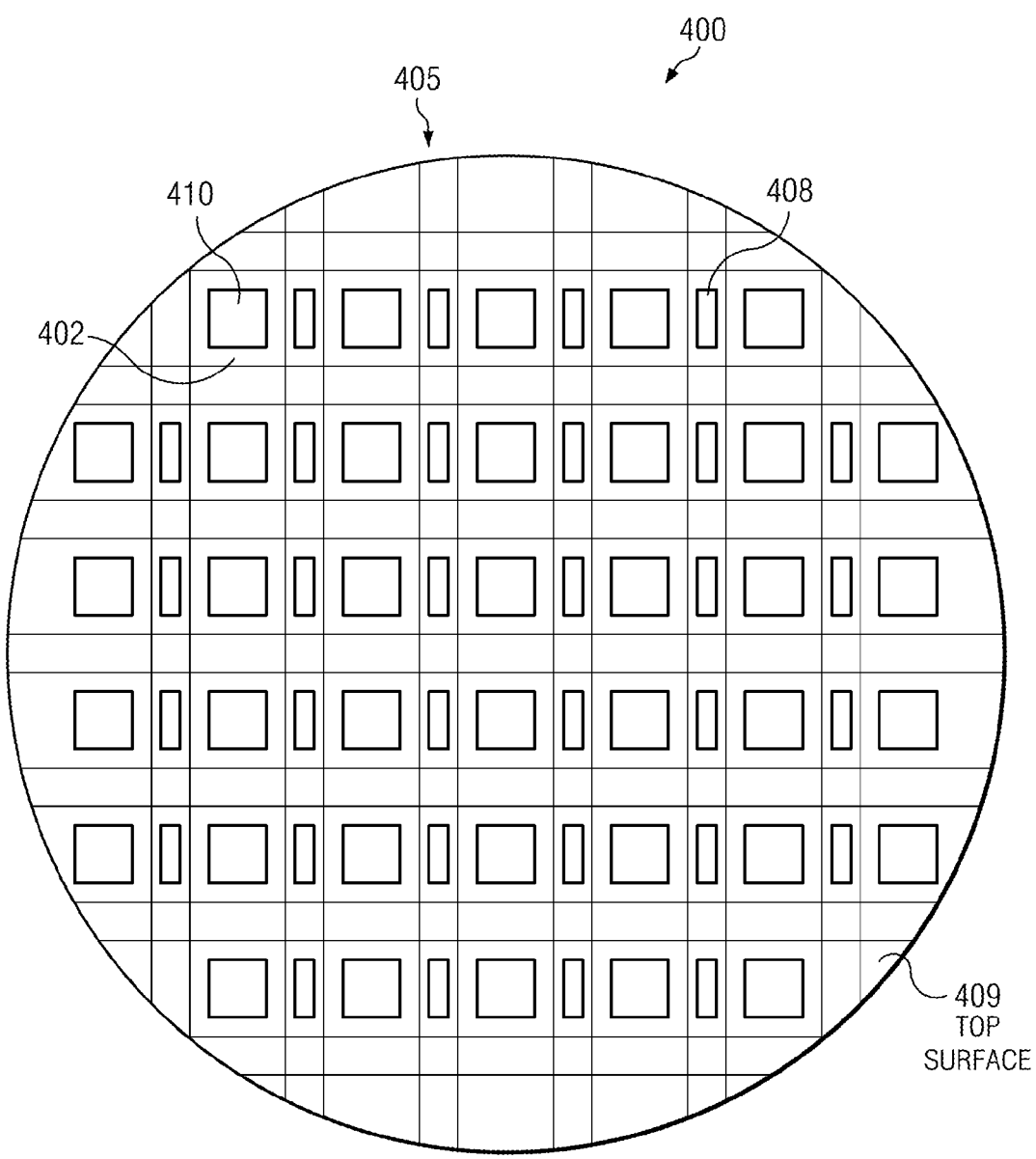
FIG. 4B is an example apparatus shown as a semiconductor wafer including a plurality of die areas having production ICs comprising active circuitry with a plurality of circuit elements, a plurality of scribe line areas between the die areas and test modules located in the scribe line areas, according to an example embodiment.

FIG. 4B depicts an example apparatus shown as semiconductor wafer 400 having a top semiconductor surface 409 having a plurality of die areas 402 separated by respective ones of a plurality of scribe line areas. A production IC die 410 comprising active circuitry including a plurality of circuit elements is fabricated at each die area 402, and at least one test module 408 such as given in FIG. 4A is fabricated at each scribe line area 405 between adjacent die areas 402. The active circuitry on IC die 410 comprises circuit elements that include MOS transistors and, optionally, bipolar transistors, as well as other related circuit components such as diodes, capacitors, resistors, signal lines, and conductive interconnects for coupling the various circuit elements.

The interconnects for the test modules may be formed to implement 1 local pin sharing for at least two, up to a maximum number set by the total number of terminals, of the devices to be tested in the test module. For example, for bipolar transistors, locally shared pins may be coupled to at least two of the base, emitter and collector terminals; and for testing MOS transistors, locally shared pins may be coupled to at least two of the gate, source, drain, body (and, as appropriate, substrate) terminals.

The test modules 408 on semiconductor wafer 400 can be used to implement a method of generating in-line data for monitoring context dependent effect parameters for MOS devices, and optionally other devices including bipolar transistors and diodes. As described above, the semiconductor wafer comprises die areas having IC die, each of which has circuit elements for performing a circuit function, scribe line areas between the IC die areas, and test modules formed in the scribe line areas. The test modules include a reference layout having at least one active reference MOS transistor with a reference spacing value for each of a plurality of context dependent effect parameters, and a plurality of variant layouts, the variant layouts each providing at least one active variant MOS transistor that provides a variation with respect to the reference spacing values for at least one of the plurality of context dependent effect parameters.

The plurality of test modules may each be tested with a probe system including a probe card to obtain electrical test data from each of the test modules that includes electrical data from the active reference MOS transistor and electrical data from the plurality of active variant MOS transistors, such as linear current, saturation current, and threshold voltage (Vt). The electrical test data is processed to generate measurements for the plurality of context dependent effect parameters from each of the plurality of test modules. For example, in a typical case, over 60 raw data points are gathered and then the data is filtered to remove outliers, after which systematic variation such as die-to-die variation is removed. Finally the median of the remaining data is taken. An average process with typically more than 40 data points should usually be sufficient to effectively remove random variation.

The method can include comparing the generated measures such as the drive current and threshold voltage for a plurality of context dependent effect parameters to a predetermined range, and raising an alarm if at least one of the generated measures has shifted outside of its respective predetermined range. The predetermined range can be set by an IC simulation model (e.g., SPICE), and the generated measures for each of the plurality of context dependent effect parameters for the active reference MOS transistor can be set to zero. The method can include utilizing the generated measures for the plurality of context dependent effect parameters to modify as a function of extracted parameters the values of physics-based parameters in transistor models such as BSIM, and software for an IC simulation model (e.g., SPICE).

Disclosed test modules can be designed to monitor as many context dependent effects as possible given the area constraint in the scribe line to find out whether they stay in the same range as modeled. If the related parameters are found to shift too much (e.g., shift outside the pre-determined range or some predetermined limit) over time (due to process variations over time) or split (e.g., process splits to improve or optimize transistor performance), then an alarm can be raised (e.g., to product or process engineers) that one or more context dependent effects have shifted, thereby enabling corrective action to be implemented.

Disclosed embodiments also include using context dependent effect parameter data to increase product yield. For example, data obtained from disclosed test modules can provide information to identify layout styles that are causing the transistor performance to drift out of the expected performance metric. Such data can also be used to check what process metrics, such as DSL thickness, well doping, etc., need to be tweaked to increase yield.

In an example implementation, the most significant context dependent effects were identified by creating hundreds of different layouts configured to capture most of the variations available within the design rules. These layouts were measured and the most significant context dependent effects were identified. The significance of a given context effect was based on its impact on the drive current. Only context effects having at least a 3% impact on the drive current relative to a zero context (reference) layout were included, and all context effects fitting criteria were ranked relative to their drive current impact.

For example, some of the test modules captured the impact of the well proximity effect (WPE). If it is shown that the WPE effect is too strong and is reducing yield, it is possible that the implant dose, angle, etc., can be adjusted to reduce this effect. Moreover, additional modules that more carefully evaluate the WPE can be evaluated to ascertain that the effect has been sufficiently reduced.

The active circuitry formed on the wafer semiconductor substrate comprises circuit elements that may generally include transistors, diodes, capacitors, and resistors, as well as signal lines and other electrical conductors that interconnect the various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements, including source regions, drain regions, bit lines, bases, emitters, collectors, conductive lines, conductive vias, etc. Moreover, disclosed embodiments can be used in a variety of semiconductor device fabrication processes including bipolar, CMOS, BiCMOS and MEMS processes.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. An apparatus, comprising:
    a semiconductor substrate having a plurality of die areas and scribe line areas between said die areas;
    integrated circuit die with active circuit elements for performing a circuit function formed on said die areas; and
    at least one test module formed in said scribe line areas, said at least one test module including:
        a reference layout that includes at least one active reference MOS transistor, said active reference MOS transistor having a reference spacing value for each of a plurality of context dependent effect parameters, and
        a plurality of variant layouts, each of said variant layouts providing at least one active variant MOS transistor that provides a variation with respect to said reference spacing values for at least one of said plurality of context dependent effect parameters.

2. The apparatus of claim 1, wherein said plurality of variant layouts includes at least one variant layout formed with at least one active variant MOS transistor that provides a variation with respect to said reference spacing values for two or more of said plurality of context dependent effect parameters.

3. The apparatus of claim 1, wherein said plurality of said context dependent effect parameters includes two or more of a length of gate oxide definition (LOD) effect, an active proximity effect (APE), a well proximity effect (WPE) and a dual stress liner (DSL) boundary effect.

4. The apparatus of claim 1, wherein said integrated circuit die and said at least one test module comprises a standard-cell based layout.

5. The apparatus of claim 1, wherein said reference layout and at least a portion of said plurality of variant layouts are single active MOS transistor layouts.

6. The apparatus of claim 1, wherein said plurality of variant layouts includes at least one variant layout that provides an active variant MOS transistor that provides a variation with respect to said reference spacing values for a plurality of said context dependent effect parameters, and at least one variant layout that provides an active variant MOS transistor that provides a variation with respect to said reference spacing values for exclusively one of said plurality of context dependent effect parameters.

7. The apparatus of claim 1, wherein said plurality of variant layouts provides at least one systematic variant layout combination that provides a first systematic layout including an active variant MOS transistor that provides a first variation with respect to said reference spacing values for a first of said plurality of context dependent effect parameters, and a second systematic layout including an active variant MOS transistor that provides a second variation with respect to said reference spacing values for said first context dependent effect parameter.

8. A method of generating in-line data for monitoring context dependent effect parameters for MOS devices, comprising:
    providing a semiconductor wafer comprising a semiconductor substrate having a plurality of die areas and scribe line areas between said die areas, integrated circuit die with active circuit elements for performing a circuit function formed on said die areas, and at least one test module formed in said scribe line areas, wherein said at least one test module includes a reference layout that includes at least one active reference MOS transistor, said active reference MOS transistor in said reference layout having a reference spacing value for each of a plurality of context dependent effect parameters, and a plurality of variant layouts, each of said variant layouts providing at least one active variant MOS transistor that provides a variation with respect to said reference spacing values for at least one of said plurality of context dependent effect parameters;
    testing a plurality of said test modules to obtain electrical test measurement data from each of said test modules comprising measurement data from said active reference MOS transistor and measurement data from said plurality of said active variant MOS transistors; and
    processing said electrical test measurement data to generate measurements for said plurality of said context dependent effect parameters from each of said plurality of test modules.

9. The method of claim 8, further comprising comparing said generated measurements for said plurality of said context dependent effect parameters to a predetermined range, and generating an alarm signal if at least one of said generated measurements is outside said predetermined range.

10. The method of claim 8, wherein said predetermined range is set by an integrated circuit simulation model, and said generated measurements for each of said plurality of context dependent effect parameters for said active reference MOS transistor are set to zero.

11. The method of claim 9, further comprising utilizing said generated measurements for said plurality of said context dependent effect parameters to modify software for an integrated circuit simulation model.

12. The method of claim 8, wherein said plurality of said context dependent effect parameters includes two or more of a length of gate oxide definition (LOD) effect, an active proximity effect (APE), a well proximity effect (WPE) and a dual stress liner (DSL) boundary effect.

13. The method of claim 8, wherein said integrated circuit die and said at least one test module comprise standard cell-based layouts.

14. The method of clam 8, wherein said reference layout and at least a portion of said plurality of variant layouts are single active MOS transistor layouts.

15. The method of claim 8, wherein said plurality of variant layouts include at least one variant layout that provides an active variant MOS transistor that provides a variation with respect to said reference spacing values for a plurality of said context dependent effect parameters, and at least one variant layout that provides an active variant MOS transistor that provides a variation with respect to said reference spacing values for exclusively one of said plurality of context dependent effect parameters.

16. The method of claim 8, wherein said plurality of variant layouts provide at least one systematic variant layout combination that provides a first systematic layout including an active variant MOS transistor that provides a first variation with respect to said reference spacing values for a first of said plurality of context dependent effect parameters and a second systematic layout including an active variant MOS transistor that provides a second variation with respect to said reference spacing value for said first context dependent effect parameter.

* * * * *